United States Patent
Sheats (10) Patent No.: US 7,300,824 B2
(45) Date of Patent: Nov. 27, 2007

(54) METHOD OF PACKAGING AND INTERCONNECTION OF INTEGRATED CIRCUITS

(76) Inventor: James Sheats, 244 Webster St., Palo Alto, CA (US) 94301

( * ) Notice: Subject to any disclaimer, the term of this patent is extended or adjusted under 35 U.S.C. 154(b) by 132 days.

(21) Appl. No.: 11/206,606

(22) Filed: Aug. 18, 2005

(65) Prior Publication Data

US 2007/0040258 A1   Feb. 22, 2007

(51) Int. Cl.
*H01L 21/44*   (2006.01)
*H01L 21/48*   (2006.01)
*H01L 21/50*   (2006.01)

(52) U.S. Cl. .................. 438/126; 438/127; 438/778; 438/780; 438/781; 257/783; 257/787; 257/E23.124

(58) Field of Classification Search ............. 438/126, 438/127, 778, 780, 781; 257/783, 787
See application file for complete search history.

(56) References Cited

U.S. PATENT DOCUMENTS

| | | | |
|---|---|---|---|
| 5,800,650 A | 9/1998 | Anderson et al. | |
| 5,870,289 A * | 2/1999 | Tokuda et al. | ............. 361/779 |
| 5,872,051 A | 2/1999 | Fallon et al. | |
| 5,933,712 A | 8/1999 | Bernhardt et al. | |
| 5,960,961 A | 10/1999 | Gutentag | |
| 6,027,958 A | 2/2000 | Vu et al. | |
| 6,140,707 A | 10/2000 | Plepys et al. | |
| 6,284,086 B1 | 9/2001 | Cardellino et al. | |
| 6,284,569 B1 | 9/2001 | Sheppard et al. | |
| 6,357,594 B1 | 3/2002 | Gutentag | |
| 6,404,643 B1 | 6/2002 | Chung | |
| 6,444,921 B1 | 9/2002 | Wang et al. | |
| 6,484,393 B1 | 11/2002 | Chan | |
| 6,580,031 B2 | 6/2003 | Chung | |
| 6,580,035 B1 | 6/2003 | Chung | |
| 6,617,671 B1 | 9/2003 | Akram | |
| 6,717,819 B1 | 4/2004 | Chung | |
| 6,734,370 B2 | 5/2004 | Yamaguchi et al. | |
| 6,785,144 B1 | 8/2004 | Akram | |
| 6,800,947 B2 | 10/2004 | Sathe | |
| 6,927,096 B2 * | 8/2005 | Shimanuki | .................. 438/113 |

\* cited by examiner

*Primary Examiner*—Nitin Parekh
(74) *Attorney, Agent, or Firm*—Tue Nguyen (57) ABSTRACT

A method is disclosed for packaging semiconductor chips on a flexible substrate employing thin film transfer. The semiconductor chips are placed on a temporary adhesive substrate, then covered by a permanent flexible substrate with a casting layer for planarizingly embedding the chips on the permanent substrate before removing the temporary substrate. With the surface of the chips coplanar with the surface of the complete structure without any gaps, interconnect metal lines can be easily placed on the uninterrupted surface, connecting the chips and other components.

16 Claims, 10 Drawing Sheets

METHOD OF PACKAGING AND INTERCONNECTION OF INTEGRATED CIRCUITS

FIELD OF THE INVENTION

The present invention is related generally to electronics packaging and, more particularly to packaging and interconnection of integrated circuits on a flexible substrate.

BACKGROUND OF THE INVENTION

Board level semiconductor packaging and interconnection of integrated circuits (IC) is the process to electrically connect the IC chips to each other and to external circuitry to function as an electronic system. The IC chips have input and output contact pads and the interconnection is typically an array of metallic connections within a support substrate. The normal packaging process of forming a fully functional product based on integrated circuits usually includes placing the semiconductor IC chips on a printed circuit board (PCB) and soldering their contact pads to contact pads on the PCB. Several connection techniques are widely used and well known in the art. These include wire bonding, tape automated bonding (TAB), flip-chip bonding, etc.

The earliest process is wire bonding, the process of placing the ICs face up on the PCB, and bonding fine wire conductors from the IC contact pads to the PCB pads. Wire bonding is by far the most common and economical connection technique, usually by thermocompression, thermosonic or ultrasonic processes. Because wire bonding requires wires to be welded to the chip, there must be adequate space to accommodate the wires.

TAB utilizes patterned metal on a polymeric tape to join the chips together, involving bonding gold-bumped pads on the chips to external circuitry. TAB requires mechanical force such as pressure or a burst of ultrasonic vibration and elevated temperature to accomplish the welding between the wires or bumps and the designated surface.

The increase in density of input/output (I/O) lines caused the industry to shift to so-called "flip-chip" methods, in which the IC is placed on the PCB face down, and a direct metal-to-metal contact is made between the pads. Most commonly, this is some variant of a process in which a low-melting metal (solder) is first placed on the pads of one member (for example by dipping into a container of liquid metal, after the surface has been treated in such a way that solder will adhere only to the pads), forming solder "bumps". The other member also has "bumps" formed on the pads; the non-solder bumps are some appropriate metal, which must be part of the final lithographic processing step. The IC is placed on the PCB by a pick-and-place machine with enough accuracy to orient the solder bumps over the correct locations, and with sufficient heat to liquefy the solder, a strong metal-metal connection is then made. The empty space between connections is filled ("underfilled") with epoxy so as to strengthen the adhesion and prevent failure due to corrosion of the metal and to mechanical stress from heating/cooling cycles and the mismatch of coefficients of thermal expansion (CTE) between the IC and the PCB.

A major advantage of flip-chip bonding over wire bonding and TAB is that the connection paths are shorter, and therefore have better electrical characteristics. In addition, flip-chip bonding requires minimal mounting area, which results in further overall cost saving. However, its costs and technical limitations are significant such as bump forming cost, underfilling manufacturing complexity and cost, long term reliability cost due to thermo-mechanical stresses, and environmental cost.

These techniques are appropriate to the use of solid PCBs and rigid ICs, formed by dicing silicon wafers that are typically 0.5 mm thick. It is desirable for many applications to have flexible electronic products, for example flexible display backplanes, in which case the PCB must be replaced by a printed circuit tape (PCT), often known in the industry as a "flex circuit". In addition, the integrated circuit must be flexible. Flexible integrated circuits can be fabricated by direct deposition and patterning of semiconductor and other materials to form interconnected transistors on plastic (or other flexible substrate). However, the performance of such devices tends to be less than optimal, and the processes for fabricating them less well developed and more costly than for the well-known processes of fabricating transistors in silicon wafers.

One way to obtain higher performance flexible circuits at affordable cost is to thin conventional wafers until they are flexible. It is now common in the industry to produce wafers thinner than 100 microns, and as thin as 20 microns or less, by a combination of grinding, polishing, and etching, and these processes add a modest fraction to the cost of the ICs. In principle, these very thin wafers (which are now quite flexible) may be diced and mounted on flexible substrates, resulting in flexible products. In practice, many problems arise in the handling of such thin (and therefore delicate) chips.

Figure 1:
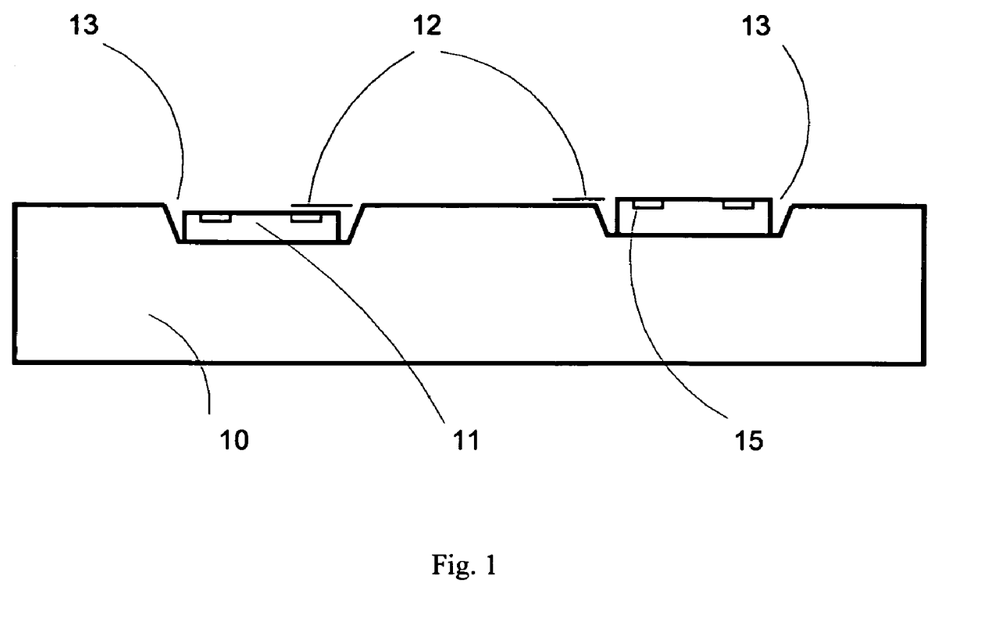
FIG. 1 shows a prior art approach of flexible chip packaging.

One approach, a process called Fluidic Self-Assembly, shown in FIG. 1, attempts to address these issues by mechanically indenting a polymer substrate 10 to approximately the thickness of a thinned silicon chip 11 having contact pads 15, which then is inserted into the depression. However, apart from the possibility of defects arising from incomplete filling of the holes, this process does not result in a highly planar surface due to variations 12 in the thickness of chips coupled with variations in the depth of the depressions, and there is still a small but significant gap 13 between the side of the chip and the side of the hole. This leads to complexity in forming the subsequent interconnect metallization. It also does not address the issue of mismatched CTEs.

Another possible approach to these problems is to apply, by lamination or casting followed by lithography, a thin film of polymer with cutouts that are the right size into which to insert the thinned ICs. This process could be low cost and high speed. However, as with the Fluidic Self-Assembly process, there would still be imperfections in the coplanarity due to the inevitable variations, and there would still be a gap between the sides of the chip and the side of the cutout.

SUMMARY OF THE INVENTION

The present invention provides an IC packaging concept in which the surface of the IC chips is coplanar with the surface of the substrate in which it is embedded, and to have no gaps between the side of the IC chips and the substrate. In this way, interconnect metal lines can be easily placed on this uninterrupted surface, connecting the various chips or other components.

The IC packaging process of the present invention provides the placement of ultrathin silicon chips in a manner appropriate for subsequent interconnection into finished circuit products similar to what are currently common in PCB-based products. The process employs a means to transfer thin films, which may include thin silicon wafers or chips, from one substrate to another without mechanical damage, and with good accuracy at high speed and low cost. This process uses a polymer, which could be converted, from the solid state to a vapor by the sequential action of light and heat.

The process is performed by first placing the chips face down on a thin layer of thermally decomposable polymer (TDP). That layer has in turn been cast on top of a temporary plastic substrate. A layer of curable polymer with low CTE and good adhesion properties is then cast in such a way as to cover the chips completely; thus its thickness is at least a few microns greater than that of the chips. Finally, a thicker permanent substrate is laminated onto this cured surface, and then the TDP is vaporized so that the temporary substrate is removed and the resulting free surface has the chips exactly coplanar with the polymer, and completely embedded in it with no gaps around the sides.

After the removal of the temporary substrate, the surface is ready for further processing to form interconnects, which may be by a low-cost and high-speed printing process, or by conventional deposition and etching techniques. Because the surface of the embedded chips and the surface of the substrate are coplanar with no gaps at the sides of the chips, providing metallization interconnections is simple with enhanced reliability. And because the chips are embedded in a material of low CTE, the reliability of the package is further enhanced with regard to mismatched CTE.

The invention is not limited to a single layer of interconnect on top of the chips. Bottom contacts or through contacts can be made through via opening in the low CTE layer by convention fabrication methods such as photolithography and etching, or laser ablation. And since the structure is highly planar, it is simple to add a dielectric layer on top of the first interconnect layer, and then a second interconnect layer with interconnection through vias.

DETAIL DESCRIPTION OF THE INVENTION

The present invention provides an IC packaging concept in which the surfaces of the embedded IC chips are coplanar with the complete structure with no side gaps to allow uninterrupted interconnect metal lines. The packaging concept further employs an interposer of low CTE between the IC chips and the substrate to improve interconnection reliability due to thermal cycling.

Figure 2A:
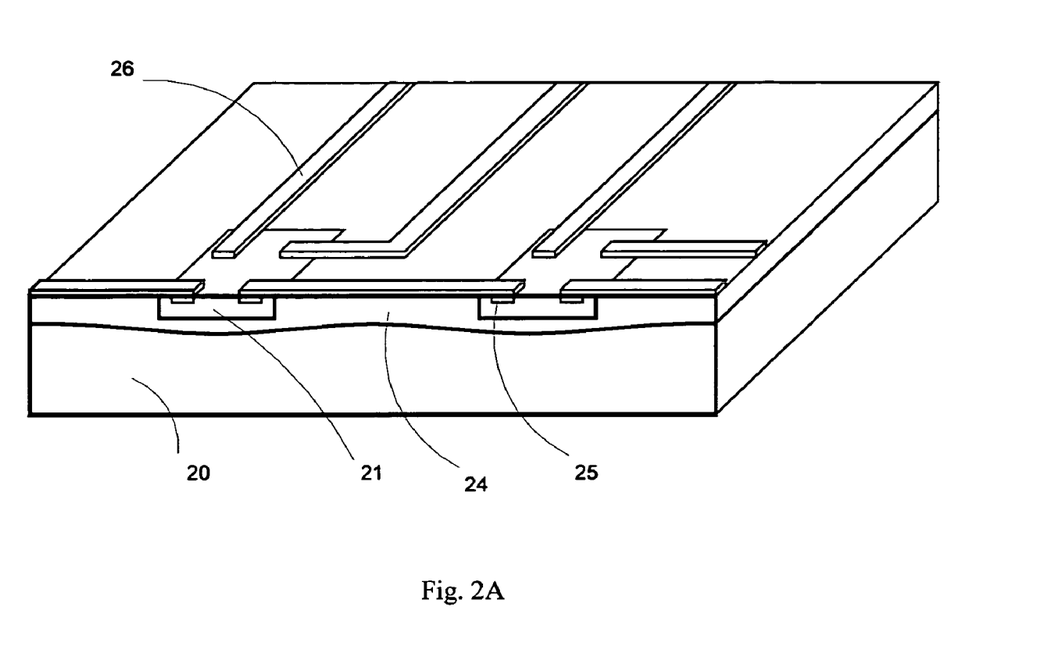
FIG. 2A shows an embodiment of the structure of the present invention flexible chip packaging.

FIG. 2A shows an embodiment of the structure of the present invention. A plurality of IC chips 21 is embedded in a substrate 20 through a casting layer 24. The IC chips contain top exposed contact pads 25, which can be connected to each other or to other external circuitry by conductive interconnect 26. One of the novel results of the present invention packaging structure is to have the surface of the IC chip 21 coplanar with the surface of the complete structure in which it is embedded, and to have no gaps between the side of the IC and the substrate. In this way, interconnect metal lines can be easily placed on this uninterrupted surface, connecting the various chips and other components. If the chip surface extends above or below the structure surface by even as much as one micron, step coverage issues arise which make good, reliable interconnections more difficult. In practice, the step height of prior art fabrication process is expected to be even larger of approximately 3-5 microns. In addition, the step height of prior art fabrication process will not be uniform across the printed circuit tape, since there will inevitably be processed-induced variations, which could easily be a micron or more of thickness. Thus the present invention of coplanar, gapless IC packaging provides the benefit of improved reliability and the enabling of simple, low cost and high speed interconnect fabrication process such as interconnect printing process.

The substrate 20 is preferably a flexible substrate, and more preferably a common, inexpensive polymer substrate such as polyethylene terephthalate (PET). The casting layer 24 is preferably a material of coefficient of thermal expansion (CTE) similar to that of silicon, or a designed CTE that is optimal for minimizing stress on the contacts to improve the reliability of the package. The mismatch of CTE between silicon (which dominates the IC) and typical substrate plastics is a major source of reliability problems, producing cyclic stress on the contact points where the metal lines join the chips, and can lead to failures. The CTE of Si is about 2.7, while that of a common, relative inexpensive substrate material polyethylene terephthalate (PET) is about 20. Many other polymers, which might be useful from the standpoint of cost, chemical resistance, etc., have even higher CTEs. Better reliability could be achieved with low CTE substrate polyimides such as PI2611 (made by HD Microsystems), but these materials are relatively expensive compared to substrate materials such as PET. However, in the present invention, they are used in a minimal thickness, similar to an interposer, and thus do not contribute significantly to the cost increase.

Figure 2B:
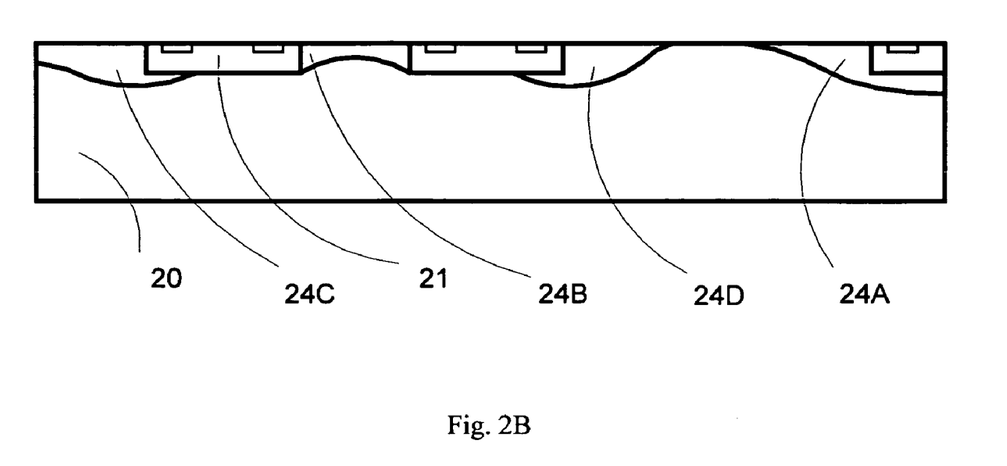
FIG. 2B shows an embodiment of the present invention structure having various casting layer configurations.

FIG. 2B shows another embodiment of the present invention having different casting layer configuration. The casting layer 24 can cover completely the chips and other surfaces of the releasable adhesive (FIG. 2A), the casting layer 24A completely covers the chip but not completely cover the surfaces of the releasable adhesive, the casting layer 24B can attach only to the sides of the chips, or the casting layer 24C can partially cover the chips, or the casting layer 24D can leave the releasable adhesive substantially uncovered. The complete coverage of the chips is the preferred mode of operation since the casting can acts as a low CTE interposer between the chips and the substrate.

Figure 2C:
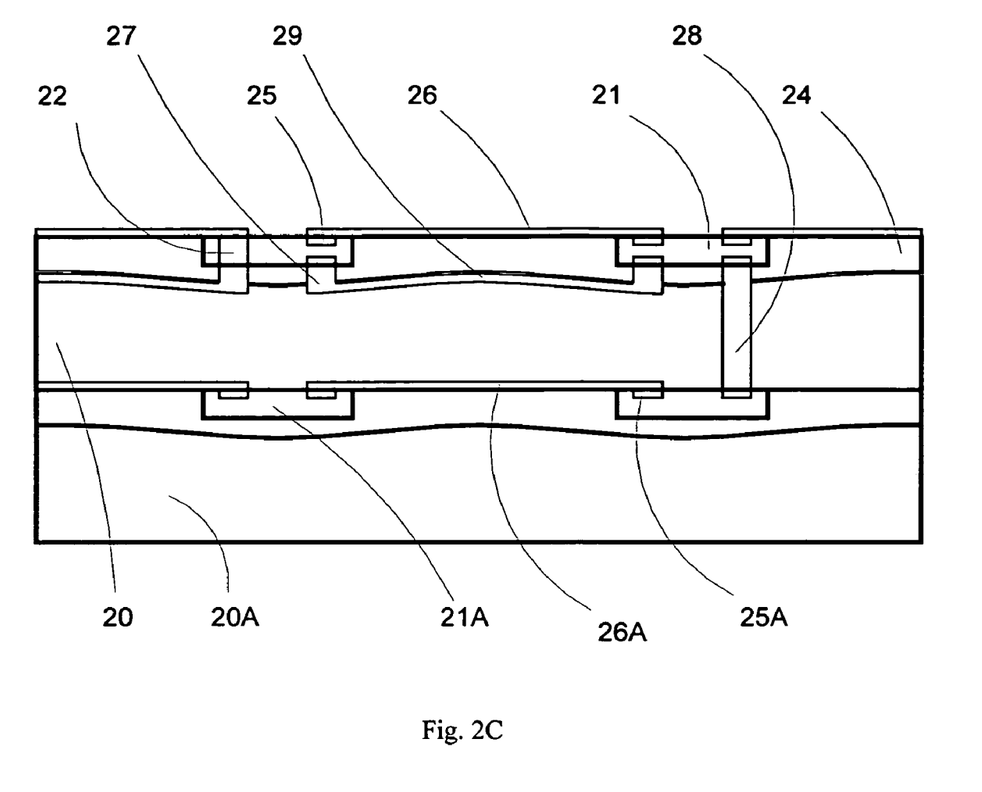
FIG. 2C shows an embodiment of the present invention multiple substrate structure.

FIG. 2C shows another embodiment of the present invention with multiple substrates having via interconnection. Two substrates 20 and 20A are stacked on each other, and are connected with via 28 to connect chips 21 and 21A. Connections 26 and 26A are used to top connect contact pads 25 and 25A, and vias 27 can serve to connect the chips through interconnection 29 at the casting layer 24 level. The chip can have a passthrough contact pad 22 to connect the top interconnect with bottom interconnect.

The terms "coplanar" and "gapless" as used in the present invention have a relative meaning with respect to the application of conductor interconnects. For example, if the interconnection process can tolerate a step height difference and a gap of a few hundred nanometers, then it is coplanar and gapless if the surface is smoother and with no gaps larger than a few hundred nanometers. The term "coplanar" could also mean a substantially smooth transition from the chip surface to the surrounding surface with no abrupt step. The smooth transition can be roughly defined as a surface with no acute angles, to enable the enhanced reliability of interconnect connection. The term "gapless" means no substantial void around the chips, again to enable the enhanced reliability of interconnect connection.

Fabrication of the present invention of coplanar, gapless, low CTE mismatch IC packaging structure starts by first placing the IC chips face down on a thin releasable adhesive layer, coated on top of a temporary substrate. A layer of low CTE curable polymer is then applied to cover the chips. Finally, a thicker permanent substrate is laminated onto this cured surface, and then the releasable adhesive layer is released to remove the temporary substrate. The resulting free surface has the chips coplanar with the polymer, completely embedded in it with no gaps around the sides and separated from the substrate with an interposer to improve CTE mismatch. After this, the surface is ready for further processing to form interconnects.

Figure 3A:
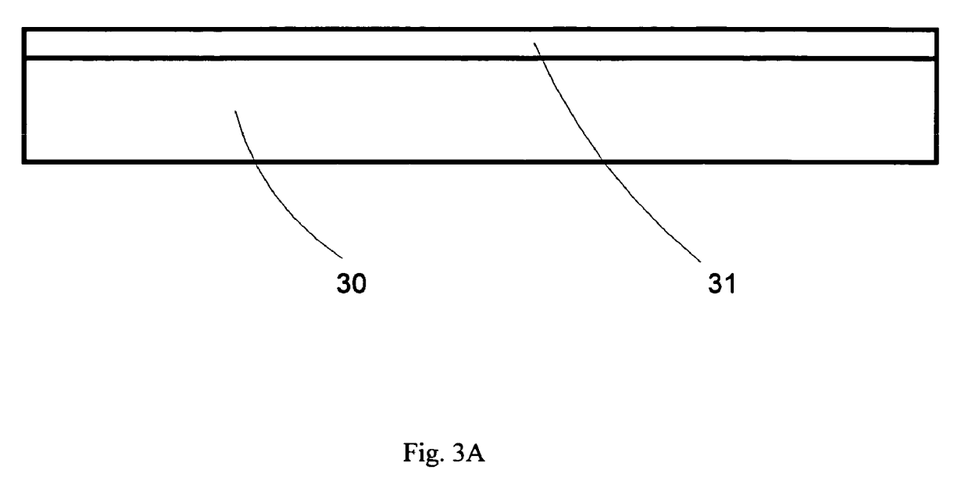
FIG. 3 shows an embodiment of fabrication process of the present invention chip packaging.

FIGS. 3A to 3F show a detailed process of an embodiment of the present invention packaging process. FIG. 3A shows a starting substrate, comprising a temporary substrate 30 coated with a thin releasable adhesive layer 31 such as a thermally decomposable polymer (TDP). TDP is preferably employed as a releasable adhesive since it can be vaporized completely by heat, leaving a clean surface, but other releasable adhesives can be used. The thickness of the adhesive layer 31 is typically in the range of a few microns, for example from 1 to 10 microns, and has been coated on top of the temporary substrate 30. The temporary substrate 30 is preferably a flexible substrate, for example a plastic substrate such as PET, but can also be a rigid substrate.

Figure 3B:
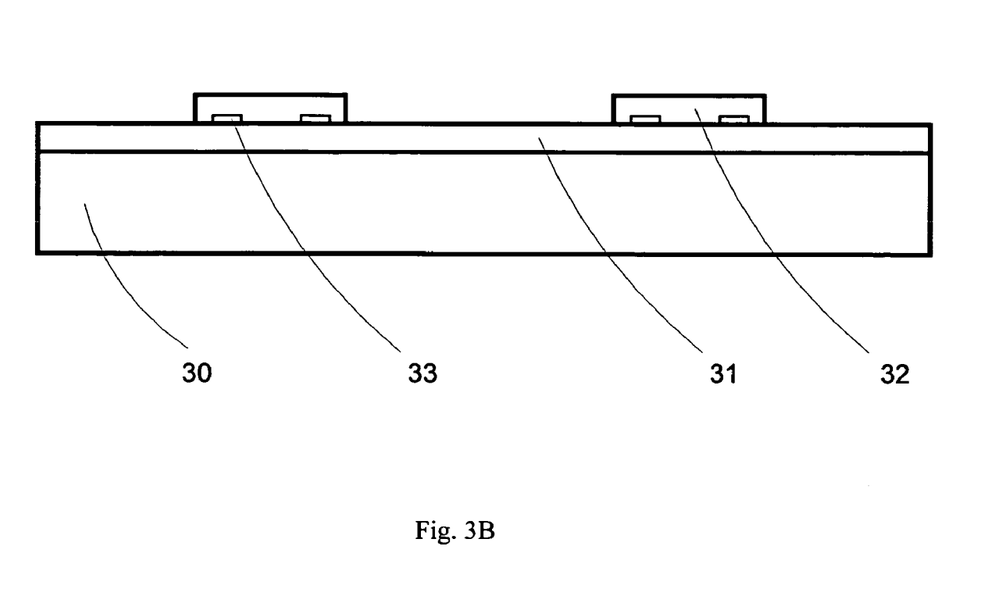

A plurality of IC chips 32 is then placed face down on the releasable adhesive layer 31 so that the chip contact pads 33 are contacting the adhesive layer as shown in FIG. 3B.

Figure 3C:
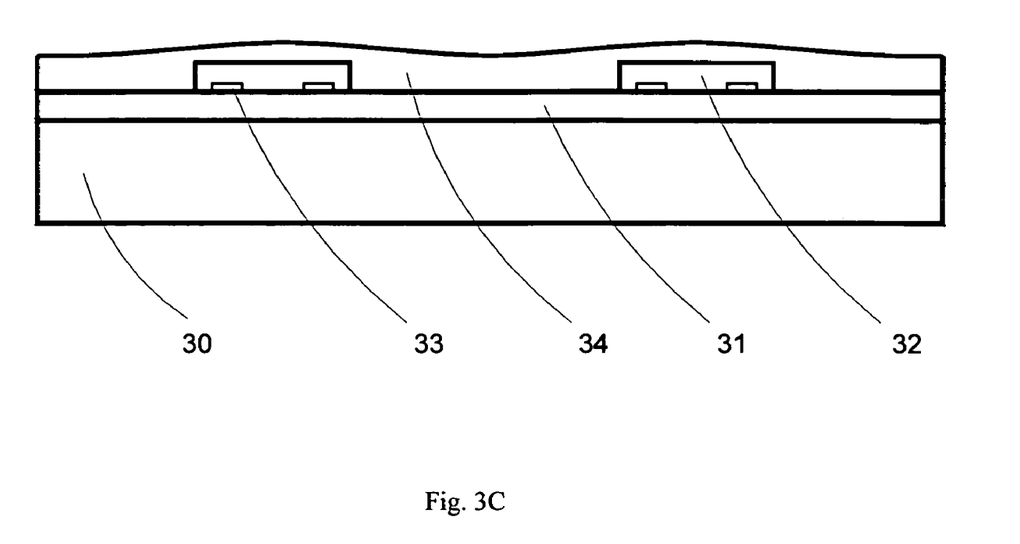

A layer 34 of curable polymer with low CTE and good adhesion properties is then cast in such a way as to cover the chips completely, as shown in FIG. 3C; thus its thickness is at least a few microns greater than that of the chips. Certain types of polyimide, such as PI2611 as sold by HD Microsystems, for example, are a good choice since they can be made to have CTEs closely matching silicon, or they can be intermediate between silicon and the substrate polymer. The material of layer 34 is preferably chosen to be highly flowable or the surface can also be optionally treated to improve its wettability so that layer 34 can well cover the lower corners of the IC chips 32 to prevent formation of voids. Layer 34 preferably covers completely the IC chips, but in some embodiments, layer 34 could attach only to the sides of the IC chips to hold the chips in place. The curable layer 34 may be coated by spin coating, by screening, or by spray coating or by other well-known solution film coating techniques. After the coating operation, an optional soft baking can be performed to evaporate remaining solvent. Once curing layer material is poured, it can be set or cured by means appropriate for its composition, for example, heat, time, ultraviolet radiation, other forms of radiation, or combinations of these steps.

Figure 3D:
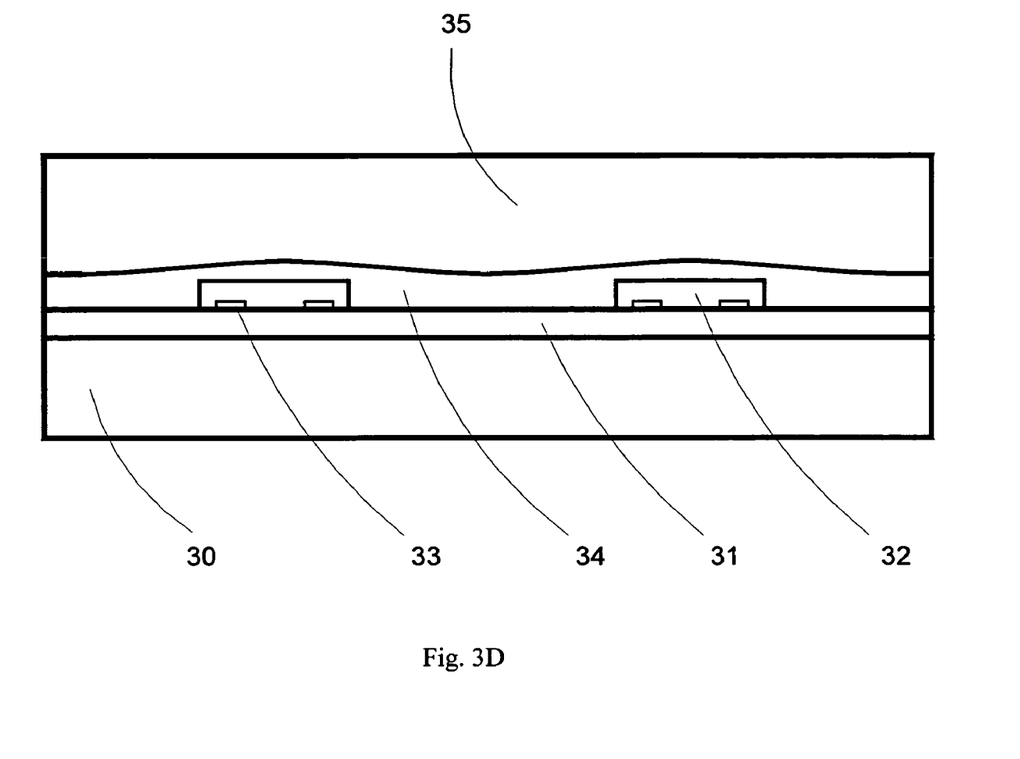

A thicker permanent substrate 35, such as PET or other polymer, is then laminated onto this cured surface, as shown in FIG. 3D. An optional permanent adhesive layer can also be applied between the casting layer 34 and the permanent substrate 35 to improve the adhesion.

Figure 3E:
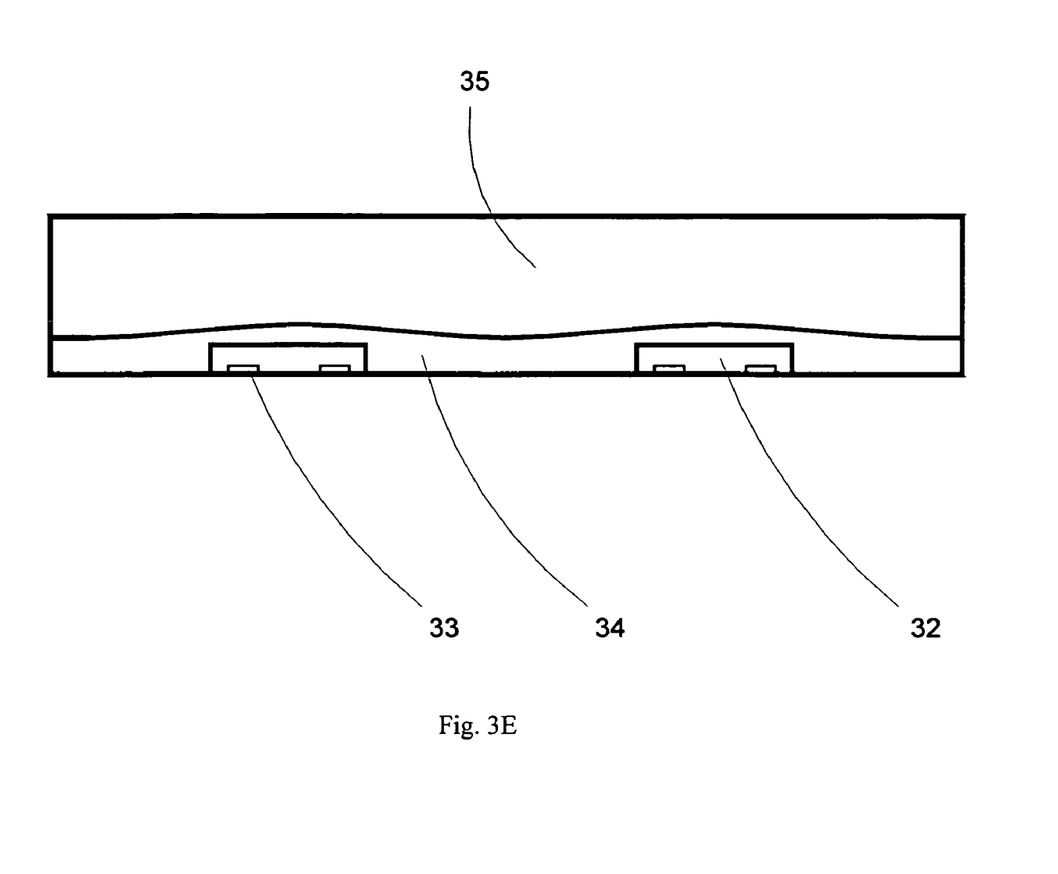

Finally, the releasable adhesive layer 31 is released so that the temporary substrate 30 is removed, as shown in FIG. 3E. The releasable adhesive layer is preferably a thermally decomposable polymer (TDP), and the releasable process is the applying of heat and optionally light to vaporize the TDP. The resulting packaging assembly is thus a flexible permanent substrate 35 having the chips 32 coplanar with the polymer 34, and completely embedded in it with no gaps around the sides. Furthermore, the use of the thin low CTE layer 34 reduces the CTE mismatch, and thus improves the contact reliability against thermal recycling.

The thermally decomposable polymer, and the means to transfer thin films, which may include thin silicon wafers or chips, from one substrate to another without mechanical damage, and with good accuracy at high speed and low cost have been disclosed in a co-pending applications of the same inventor, "Lamination and delamination technique", filed May 23, 2003, Ser. Nos. 10/444,219, 10/444,395, and 10/444,435, hereby incorporated by reference. This process uses a polymer, which can be converted from the solid state to a vapor by the sequential action of light and heat. The amount of heat required is modest (far less than is used in such processes as thermal dye transfer or laser ablation), and amenable to the management of heat-sensitive structures.

The use of a thermally decomposable polymer as a releasable adhesive layer is not essential to the present invention, though it is convenient and advantageous. Other release layers, designed such that the product laminate may be pulled easily away from the temporary substrate, can also be used. Such release layers are well known in applications where labels are delivered on a backing substrate but are designed to be easily pulled away. In this case, the release layer must be carefully chosen with respect to the embedding polymer and the temporary substrate so as to have the desired release properties, immiscibility with the embedding polymer, and no unwanted contamination on the IC pads. However, an optional brief plasma or solution cleaning step can be used as appropriate and is in many cases adequate to remove contamination.

After the release of the temporary substrate, the surface is ready for further processing to form interconnects, which may be by a low-cost and high-speed printing process (which might include offset, gravure, screen, or inkjet printing, or any other desired method), or by conventional deposition and etching techniques. This choice will be made according to various factors such as the feature size and other performance specifications of the final product. The conductive interconnects can be electrically conductive traces, comprising metallization or a conductive polymeric material to provide electrical connection between the contact pads of the IC chips and other external circuitry.

The IC chips may be any types of semiconductor device such as, for example, memory devices, central processing units, signal processing units, controller devices, or any combination of these or other devices. Further, other electronic components can be used instead of IC chips, such as a passive component such as a resistor, capacitor, or inductor, or any other type of electronic component, whether or not implemented as an IC, such as an oscillator, filter, sensor, variable resistor, fuse, or coil. Multilayer interconnect structures, including embedded passives (resistors, capacitors, etc.) or power distribution/ground plane structures can also be provided in this assembly. All these devices are preferably formed in layers of approximately the same thickness as the ICs (~5-25 microns), and then applied (face down, like the chips) alongside the chips. At the end of the process, the pads in these structures will be available for connection to each other and to the chips by coplanar metal lines.

The flexible permanent substrate can be any polymeric film, such as PET, a polyimide film such as Kapton, or a benzocyclobutene (BCB)-based polymer dielectric such as Cyclotene, a resin-impregnated fabric or a synthetic fabric, polyester, polyparabanic acid, epoxy, and fiberglass.

The adhesive can also be a single-piece adhesive or a multiple-piece adhesive. The adhesive can be silicone, polyimide, epoxy, thermoplastic adhesive materials, flexible dielectric adhesives, screen-printable flexible thermosetting dielectric adhesives, photo-etchable flexible thermosetting dielectric adhesive, and flexible hydrophobic dielectric adhesives using non-polar hydrophobic polymer carrier medium.

In carrying out this invention, it is vital to have a clean, abrupt interface between the releasable adhesive 31 and the cast layer (low CTE layer) 34. Thus the solvent for the cast layer should not dissolve the releasable adhesive, or result in any intermixing.

For thermally decomposable polymer (TDP) adhesive, castable polyimides are soluble only in highly polar solvents such as N-methylpyrrolidone (NMP), whereas the TDPs are typically soluble in solvents of low polarity. However, if for a specific choice of two materials for these two layers the solubility difference is insufficient, then a thin intermediate layer (~10 nm-1 micron) of a water-soluble polymer such as polyvinylalcohol (PVA) may be cast on top of the thermally decomposable polymer. PVA is known to be highly immiscible with most intermediate-polarity polymers (and their casting solvents) such as are used in photolithography. When the TDP is removed, the layer of PVA or equivalent can be removed with water.

Alternatively, it might be preferred to use a highly nonpolar intermediate layer such as polystyrene, which would be highly incompatible with (insoluble in) the polyimide. The invention is not limited to a nonpolar TDP and a polyimide embedding layer, so these choices will be made according to the selection of TDP and embedding layer.

In another alternative, the intermediate layer can be an ultrathin cross-linked layer, insoluble in any solvent. A wide variety of cross-linking agents, especially UV-sensitive ones, can be incorporated into the intermediate layer polymer. It is not important for the intermediate layer to be completely immiscible in the TDP; only in the embedding layer. Once cross-linked, the layer cannot be dissolved or penetrated by the embedding layer. At the end of the process, the ultrathin intermediate layer is removed by a brief plasma etch treatment. By keeping the thickness to less than 100 nm, this removal adds little to process cost and still results in a very planar surface.

Figure 4A:
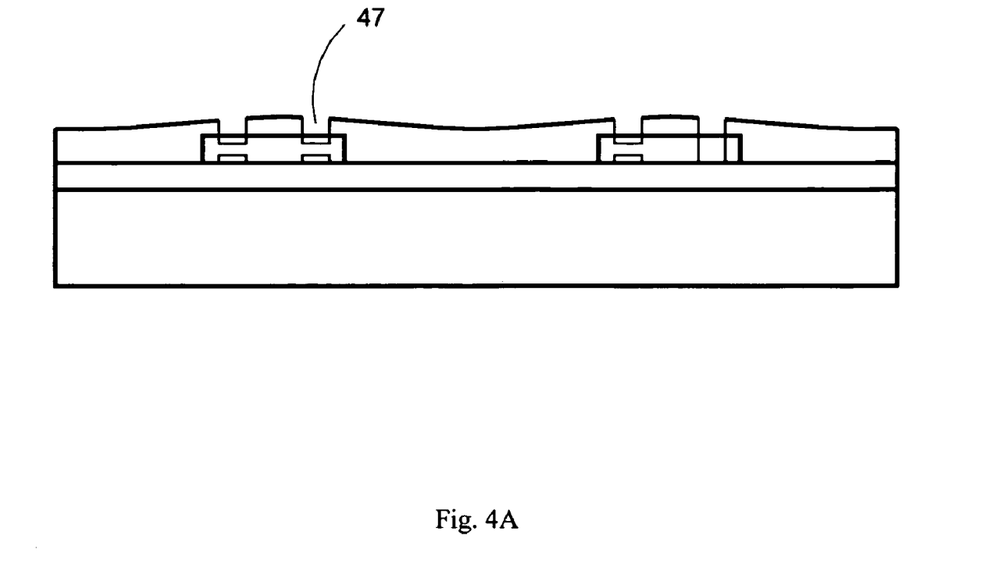
FIG. 4 shows another embodiment of fabrication process of the present invention chip packaging.
Figure 4B:
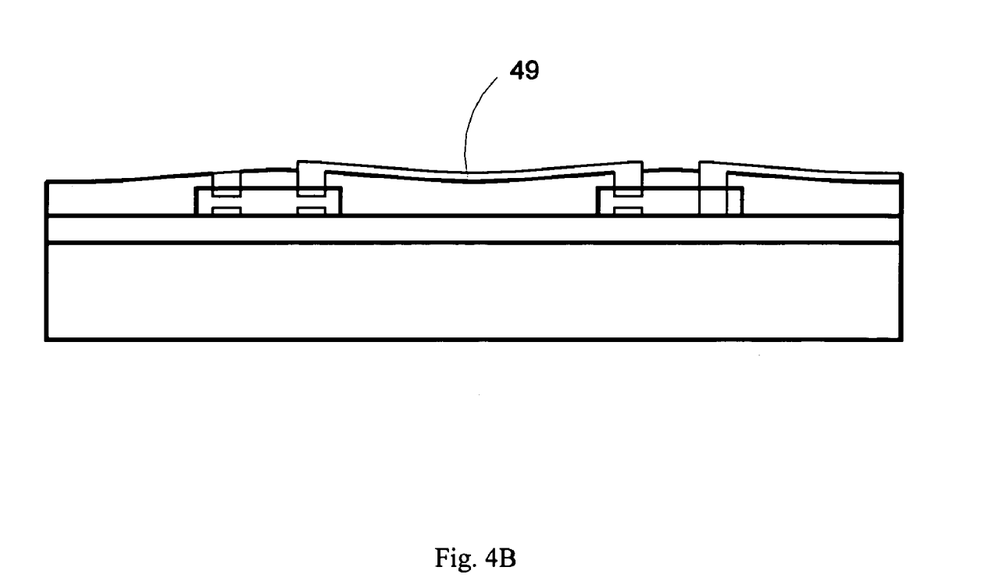

The invention is not limited to a single layer of interconnect on top of the chips. Because one starts with a highly planar surface, it is simple to add a dielectric layer on top of the first interconnect layer, and then a second interconnect layer. Thus the multilayer structures could be incorporated into the final substrate. Contact to these can be made through vias 47 opened through the cast low-CTE layer (see FIG. 4A), which is typically not more than about 25 microns thick and may be as little as 5 microns or less. Optional interconnects 49 can be made onto the cast low-CTE layer (see FIG. 4B) before the application of the permanent substrate. Interconnect can also be made in the permanent substrate before attaching to the cast layer. Either patterning such as photolithography and etching, or laser ablation (as is commonly used in the flex-circuit industry) can be used to form these vias and then generating the interconnect through these vias.

Patterning techniques such as photolithography may be used and may be patterned by a conventional ultraviolet light exposure through a mask pattern followed by development. As another approach, a photoresist layer may be formed and patterned to produce an etch mask. In this case, wet etching in a basic solution or dry etching (plasma etching) may be used. As yet another patterning approach, the apertures may be formed in the polyimide layer by laser drilling or by plasma etching through a patterned photoresist layer.

The result of this invention is a flexible printed circuit product incorporating essentially any type of integrated circuit component in a flexible tape with robust, reliable interconnections capable of withstanding thermal cycling and mechanical shock as experienced in consumer use, and at a low cost because of the high-speed coating and laminating processes used.

What is claimed is:

1. A method for packaging semiconductor chips comprising steps in an order of
    providing a temporary substrate;
    coating the temporary substrate with a releasable adhesive layer;
    placing a semiconductor chip on a portion of the releasable adhesive layer;
    casting a polymer layer to cover the semiconductor chip and the releasable adhesive layer to smooth out a height difference of the polymer layer between the height above the chip and that at surrounding area without the chip, wherein the polymer layer does not substantially interfere with the releasability of the releasable adhesive layer; and
    laminating a permanent substrate on the polymer layer and releasing the releasable adhesive layer to remove the temporary substrate.

2. A method as in claim 1 further comprising a step of cleaning a surface of the chip after releasing the temporary substrate.

3. A method as in claim 2 wherein the cleaning step is a plasma cleaning.

4. A method as in claim 2 wherein the cleaning step is a solvent cleaning.

5. A method as in claim 1 further comprising a step of forming interconnect after the releasing of the temporary substrate.

6. A method as in claim 1 further comprising a step of forming a via through the casting layer.

7. A method as in claim 6 further comprising a step of forming an interconnection on the casting layer through the via.

8. A method as in claim 1, in which the casting step comprises coating an intermediate layer before casting the polymer layer, wherein the intermediate layer prevents the intermixing or desolving the releasable adhesive by the polymer layer.

9. A method as in claim 1 wherein the releasable adhesive layer is a thermal decomposable polymer.

10. A method as in claim 1 wherein the polymer layer has similar coefficient of thermal expansion as silicon.

11. A method as in claim 1 wherein the permanent substrate is a flexible substrate.

12. A method as in claim 1 wherein the semiconductor chip is thinned to less than 100 microns.

13. A method as in claim 1 wherein the polymer layer completely covers the chip.

14. A method as in claim 1 further wherein the step of laminating the permanent substrate comprises the coating a permanent adhesive layer to improve the adhesion of the permanent substrate.

15. A method for packaging semiconductor chips comprising steps in an order of
providing a temporary substrate;
coating the temporary substrate with a releasable adhesive layer;
placing a semiconductor chip on a portion of the releasable adhesive layer;
casting a polymer layer to cover the semiconductor chip and the releasable adhesive layer to smooth out a height difference of the polymer layer between the height above the chip and that at surrounding area without the chip, wherein the polymer layer does not substantially interfere with the releasability of the releasable adhesive layer; and
laminating a flexible permanent substrate on the polymer layer;
releasing the releasable adhesive layer to remove the temporary substrate; and
forming an interconnect on for the semiconductor chip.

16. A method as in claim 15 further comprising a step of laminating a plurality of chip embedded flexible permanent substrates to form a multiple substrate structure.

\* \* \* \* \*